(12) United States Patent
Kaplan (10) Patent No.: US 10,320,112 B2
(45) Date of Patent: Jun. 11, 2019

(54) MODULARLY EXPANDABLE ENCLOSURE

(71) Applicant: Multilink Inc., Elyria, OH (US)

(72) Inventor: Steve E. Kaplan, Elyria, OH (US)

(73) Assignee: Multilink Inc., Elyria, OH (US)

( * ) Notice: Subject to any disclaimer, the term of this patent is extended or adjusted under 35 U.S.C. 154(b) by 0 days.

(21) Appl. No.: 15/627,531

(22) Filed: Jun. 20, 2017

(65) Prior Publication Data

US 2017/0373426 A1    Dec. 28, 2017

Related U.S. Application Data

(60) Provisional application No. 62/354,300, filed on Jun. 24, 2016.

(51) Int. Cl.
| | |
|---|---|
| H05K 5/00 | (2006.01) |
| H01R 13/514 | (2006.01) |
| H05K 5/02 | (2006.01) |
| H01R 24/76 | (2011.01) |
| H01R 13/74 | (2006.01) |
| H01R 103/00 | (2006.01) |
| H05K 7/02 | (2006.01) |

(52) U.S. Cl.
CPC ......... *H01R 13/514* (2013.01); *H01R 13/743* (2013.01); *H01R 24/76* (2013.01); *H05K 5/0021* (2013.01); *H05K 5/0247* (2013.01); *H05K 5/0256* (2013.01); *H01R 2103/00* (2013.01); *H05K 7/023* (2013.01); *H05K 2201/043* (2013.01); *H05K 2201/10515* (2013.01)

(58) Field of Classification Search
CPC ................. H05K 5/0021; H05K 7/023; H05K 2201/043; H05K 2201/10515
USPC ........................................................ 361/735
See application file for complete search history.

(56) References Cited

U.S. PATENT DOCUMENTS 7,602,603 B2 * 10/2009 Cheng ..................... G06F 1/181
    312/223.2
9,491,872 B2 * 11/2016 Thier ................... H05K 5/0021

* cited by examiner

*Primary Examiner* — Abdullah A Riyami
*Assistant Examiner* — Justin M Kratt
(74) *Attorney, Agent, or Firm* — Renner, Otto, Boisselle & Sklar, LLP (57) ABSTRACT

A modularly expandable enclosure including a top end plate, a bottom end plate, and one or more elongated tray modules. The top end plate, the bottom end plate and the tray modules define an interior space of the enclosure. Opposite vertical ends of each tray module define an upper end connecting portion and a lower end connecting portion. The upper end connecting portion is configured for engagement with the top end plate and further configured for engagement with a lower end connecting portion of a vertically upwardly adjacent module tray. The lower end connecting portion is configured for engagement with the bottom end plate and further configured for engagement with an upper end connecting portion of a vertically downwardly adjacent tray module.

17 Claims, 10 Drawing Sheets

MODULARLY EXPANDABLE ENCLOSURE

RELATED APPLICATION DATA

This application claims the benefit of U.S. Provisional Application No. 62/354,300 filed Jun. 24, 2016, which is hereby incorporated herein by reference.

FIELD OF INVENTION

The present invention relates generally to media and electrical enclosures, and more particularly to modularly expandable media and electrical enclosures.

BACKGROUND

Media and electrical distribution enclosures or boxes that employ a modular construction typically include a series of vertically stacked individual enclosures, stacked elongated wall segments, or sections that slide relative to one another. Some existing modular distribution enclosures have various shortcomings, drawbacks, and disadvantages relative to certain applications. For example, some vertically stacked enclosures be provided with "knock out" openings, that is, removable partially stamped openings, in the surface of the end walls, to allow for routing of wiring, cable, or components from one enclosure to an adjacently stacked enclosure. Such enclosures are limited by the size of the knock out openings. Moreover, the edges of the knock out openings do not allow for a component to be mounted to the back surface across stacked enclosures. Other enclosures, although modular, suffer from being bulky or otherwise inconvenient to assemble or handle. Accordingly, there remains a need for further contributions in this area of technology.

SUMMARY OF INVENTION

The present invention is directed to a modularly expandable enclosure in which the modularity permits wiring and components to be mounted to the back surface of adjacent modules and is easy to assemble and handle. According to one aspect of the invention, a modularly expandable enclosure includes a top end plate; a bottom end plate; and one or more elongated tray modules vertically between the top end plate and the bottom end plate. The top end plate, the bottom end plate and the one or more tray modules define at least a portion of an interior space of the enclosure. Opposite vertical ends of each tray module define an upper end connecting portion and a lower end connecting portion. The upper end connecting portion may be configured for engagement with the top end plate and further configured for engagement with a lower end connecting portion of a vertically upwardly adjacent module tray. The lower end connecting portion may be configured for engagement with the bottom end plate and further configured for engagement with an upper end connecting portion of a vertically downwardly adjacent tray module.

Embodiments of the invention may include one or more of the following additional features separately or in combination.

The height of the interior space of the enclosure may be equal to the height of the one or more elongated tray modules between the top end plate and the bottom end plate.

The expandable enclosure across multiple assembled tray modules may have a continuous vertical back surface without interruptions.

The top end plate may have an inverted U-shape ledge that abuts an inverted U-shape upper distal end of the upper end connecting portion of the tray module.

The bottom end plate may have an inverted U-shape ledge that abuts an inverted U-shape lower distal end of the lower end connecting portion of the tray module.

A forward end of the top end plate may include a horizontal flange and at least one interlocking fastener boss that is configured for connection to the upper end connecting portion of the tray module, and the height of the forward end may be equal to the height of the forward flange and the height of the interlocking fastener boss.

A back end of the top end plate may include a horizontal ledge that abuts an upper distal end of the upper end connecting portion of the tray module, and at least one interlocking fastener boss that may be configured for connection to the upper end connecting portion of the tray module. The height of the back end may be equal to the height of the horizontal ledge and the height of the interlocking fastener boss.

The top end plate may be a 180 degree equivalent of the bottom end plate.

The upper end connecting portion may be a 180 degree equivalent of the lower end connecting portion.

According to another aspect of the invention, an expandable enclosure includes a top base plate, a bottom base plate and one or more vertically extending expansion modules vertically between the top base plate and the bottom base plate. Opposite vertical ends of at least one of the expansion modules may be 180 degree equivalents and may be configured for engagement with the top base plate, the bottom base plate, and either of the opposite vertical ends of another, vertically adjacent expansion module.

Embodiments of the invention may include one or more of the following additional features separately or in combination.

The expansion module may have an inverted U-shape structure including a vertically extending rear wall and vertically extending side walls projecting forwardly from the rear wall.

The expansion module may have upper and lower vertical ends and each of the upper and lower vertical ends may have an inverted U-shape edge.

The top base plate may have an inverted U-shape ledge that is commensurate with and abuts the inverted U-shape edge of the upper vertical end of the expansion module.

The bottom base plate may have an inverted U-shape ledge that is commensurate with and abuts the inverted U-shape edge of the lower vertical end of the expansion module.

According to another aspect of the invention, a modularly expandable enclosure includes tray modules each having a bottom and two sides, and mounting structure at opposite ends of the tray modules for connection with an end closure or another tray module.

Embodiments of the invention may include one or more of the following additional features separately or in combination.

The tray modules may have identical mounting structure.

One end of the tray module may be a 180 degree equivalent to the opposite end of the tray module.

An end closure may have mounting structure for connection with the mounting structure of the tray module, and a portion of the mounting structure of the tray module may be identical to a portion of the mounting structure of the end closure.

The thickness of an end closure may be less than the front to rear dimension of the sides of the tray module, and the front to rear dimension of the end closure may be less than the horizontal span between the sides.

According to another aspect of the invention, a media enclosure includes at least one tray module having a rear wall and opposite side walls projecting forwardly from the rear wall; at least one end plate for enclosing an end of the tray module, the end plate having an electrical outlet opening; and an electrical receptacle. The electrical receptacle may be mountable within the electrical outlet opening in the end plate. The electrical receptacle may include parallel rectangular slot openings for receipt of electrical flat blades of an electrical appliance. The rectangular slot openings may be oriented perpendicular to the rear wall of the tray such that the electrical receptacle provides for the ability to have the flat blades of the electrical appliance to be plugged into the openings and have clearance for the electrical appliance to project outward from a front of the enclosure.

The foregoing and other features of the invention are hereinafter described in greater detail with reference to the accompanying drawings.

DETAILED DESCRIPTION

While the present invention can take many different forms, for the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications of the described embodiments, and any further applications of the principles of the invention as described herein, are contemplated as would normally occur to one skilled in the art to which the invention relates.

Figure 1:
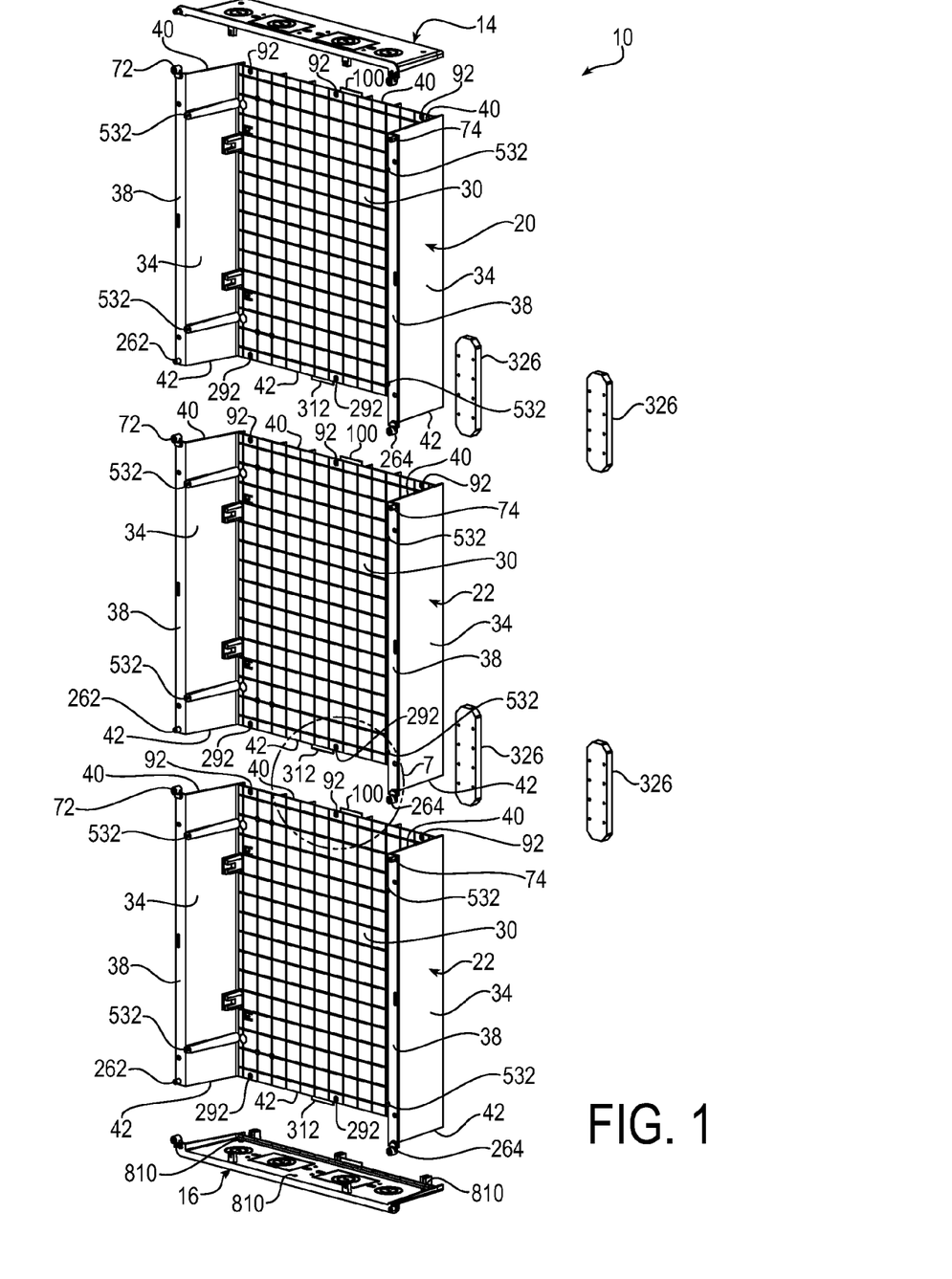
FIG. 1 is an exploded front right side perspective view of an exemplary modularly expandable enclosure of the invention, showing upper and lower end plates and three intermediate expansion modules.

FIGS. 1-8 show an exemplary modularly expandable enclosure 10 of the invention. As shown in FIG. 1, the enclosure 10 includes a top end plate 14, a bottom end plate 16, and three intermediate expansion modules 20, 22, 24. As will be described in greater detail below, the top end plate 14, best shown in FIGS. 3-6, and the bottom end plate 16 have interfaces and engaging members permitting their engagement with the top and bottom portions of the intermediate expansion modules 20, 22, 24. The intermediate expansion modules 20, 22, 24 have interfaces and engaging members permitting their engagement with the top and bottom end plates 14, 16 as well as with one another. With this interconnectability, the top and bottom end plates 14, 16 and the expansion modules 20, 22, 24 enable the enclosure 10 to be modularly expandable between a single module volume enclosure that can accommodate for example media or electrical terminal connections, or a multiple module volume enclosure, such as shown in FIG. 1, that can accommodate terminal connections as well as media or electrical components extending across the back surface of the multiple modules without interruptions.

It will be appreciated that the number of expansion modules 20, 22, 24 vertically stacked between the top and bottom end plates 14, 16 may vary depending on the requirements of a particular electrical and/or media application, and the enclosure 10 need not be limited to three expansion modules 20, 22, 24 as shown. Thus, an enclosure 10 may include a single expansion module, two expansion modules, three expansion modules as shown, or any number of expansion modules. Further, in the FIG. 1 embodiment, although the intermediate portion of the enclosure 10, that is, the portion between the top end plate 14 and bottom end plate 16, is shown to be made up of only the three expansion modules 20, 22, 24, the enclosure 10 need not be so limited. For example, the enclosure 10 may include intermediate structures other than the expansion modules 20, 22, 24, that are insertable between and engageable with a vertically adjacent expansion module. Such intermediate structures may be different in structure and configuration from the expansion modules 20, 22, 24 and may themselves adopt their own intermediate connecting structure. For example, an enclosure of the invention may include, in vertically stacked orientation, a top end plate 14, a first intermediate expansion module such as 20, 22, 24, a first intermediate structure, a second intermediate structure, a further expansion module such as 20, 22, 24, and a bottom end plate 16, where the enclosure may be modularly expanded by inserting an expansion module below the top end plate 14, below the first expansion module 20, 22, 24, above the second expansion module, or above the bottom end plate 16.

Figure 2:
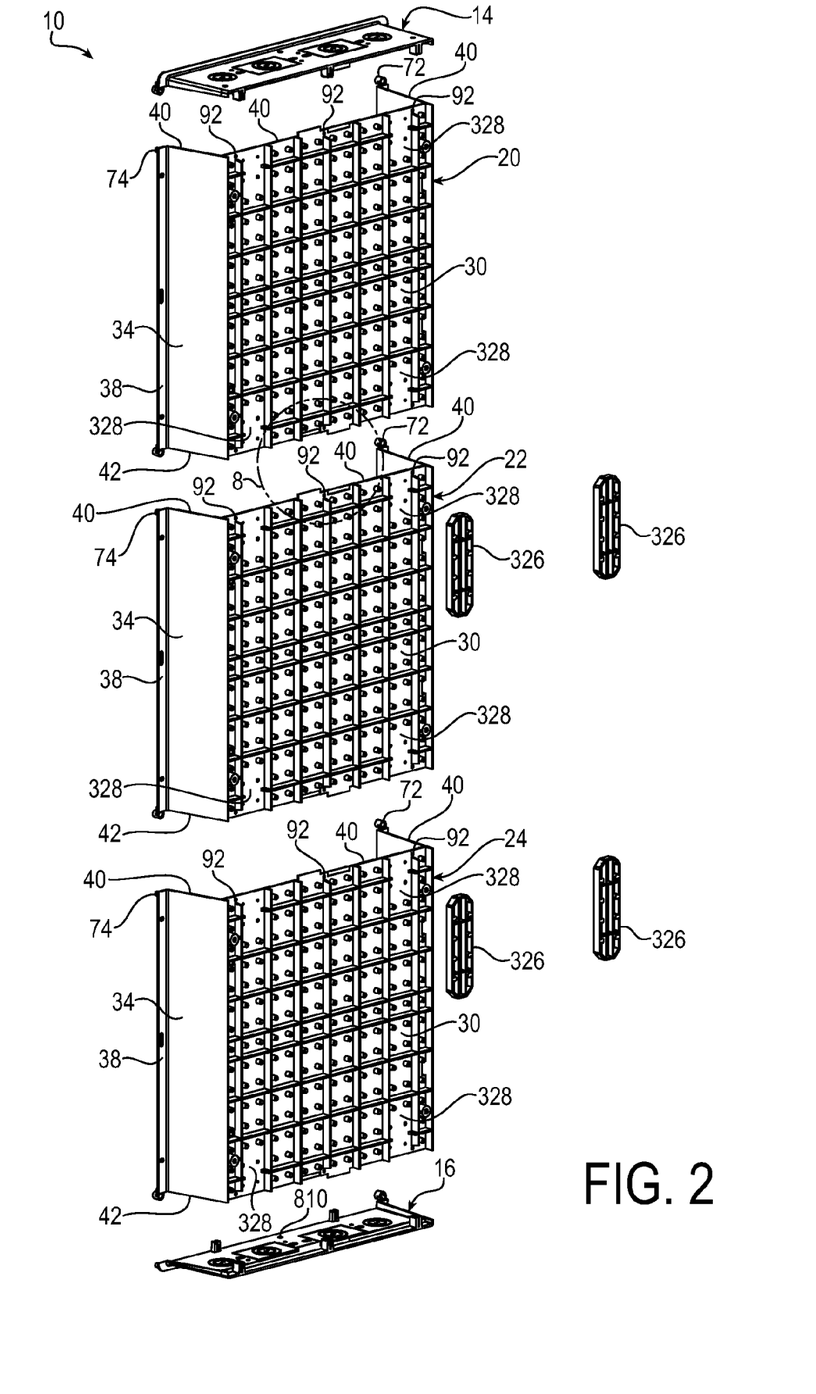
FIG. 2 is an exploded rear right side perspective view of the FIG. 1 enclosure.
Figure 3:
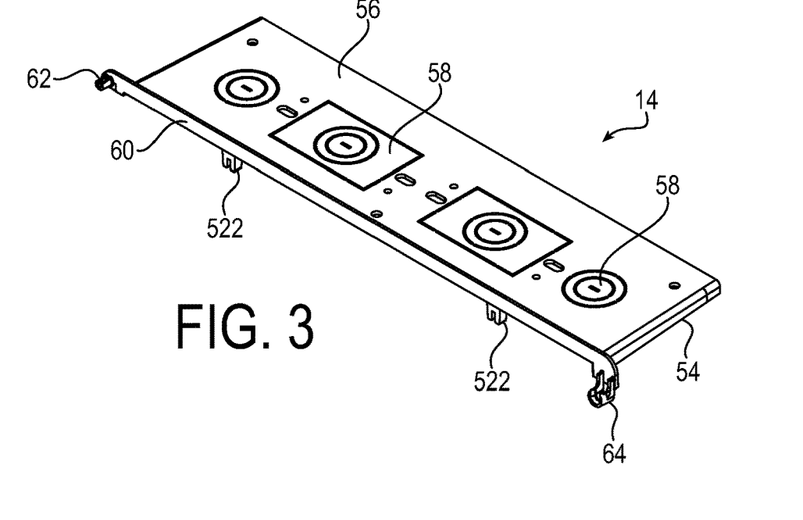
FIG. 3 is a front right side perspective view of an upper end plate, the view being of the top of the upper end plate.
Figure 4:
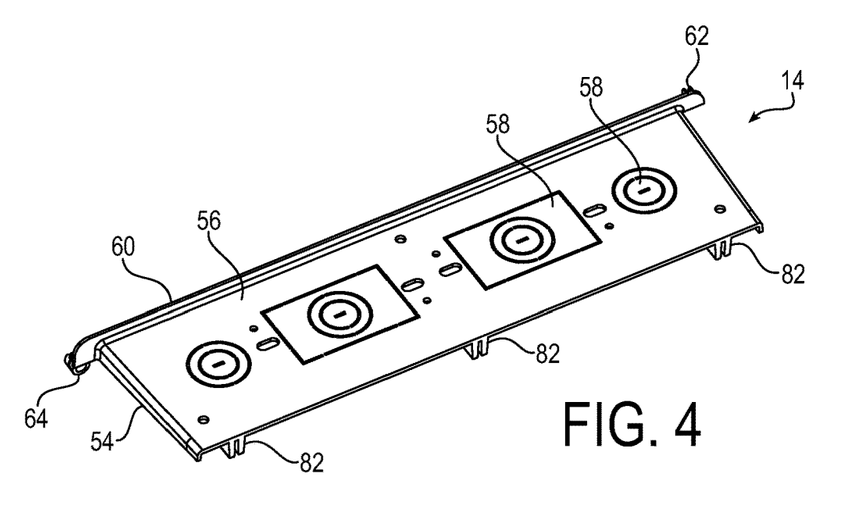
FIG. 4 is a rear right side perspective view of the FIG. 3 upper end plate, the view being of the top of the upper end plate.

Referring to FIGS. 1 and 2, the three intermediate expansion modules 20, 22, 24 may take the form of an elongated tray having an inverted U-shape structure including a vertically extending rear wall 30 and vertically extending side walls 34 projecting forwardly from the rear wall 30. The front edges of the side walls 34 may extend to form outwardly projecting left and right side flanges 38. The thickness of the rear wall 30 may be the same as the thickness of the side walls 34, as shown. The height of each expansion module 20, 22, 24 may be for example 15 inches or any other desirable height. The width of the expansion modules 20, 22, 24 at the rear wall 30 may be for example 14.5 inches. The width of the expansion modules 20, 22, 24 from the left side flange 38 to the right side flange 38 may be for example 16 inches. Such a width scheme enables the expansion modules 20, 22, 24 to be inserted into a 14.5 inch recess in a wall between standard width wall studs, with the flanges 38 in position for mounting to the edges of the studs. As will be appreciated, the intermediate expansion modules 20, 22, 24 need not be limited to the structure and sizing shown in FIG. 1 and other embodiments are contemplated. For example, the expansion modules 20, 22, 24 may be of a height and width different from that shown in FIG. 1 and, further, the expansion modules 20, 22, 24 that make up an enclosure 10 may themselves have different dimensions, for example, one expansion module may have a greater height dimension than another expansion module.

The expansion modules 20, 22, 24 extend vertically between the top end plate 14 and the bottom end plate 16. As shown in FIGS. 1 and 2, the upper and lower vertical ends 40, 42 of the expansion modules 20, 22, 24 are open. Thus, for the FIG. 1 enclosure 10 the upper and lower bounds are provided by the top and bottom end plates 14, 16. The interior height and accordingly the interior space or volume of the FIG. 1 enclosure 10 is thus defined by the top end plate 14, the bottom end plate 16, and the number of vertically stacked expansion modules 20, 22, 24, which in the FIG. 1 embodiment is three. Of course, for enclosures in which other intermediate structures are inserted between the expansion modules 20, 22, 24 as described above, the interior height and volume will be greater.

The upper and lower vertical ends 40, 42 of the expansion modules 20, 22, 24, and the top and bottom end plates 14, 16, have interfaces and engaging members that enable their connection to vertically adjacent components. The upper vertical end 40 of the expansion module 20, 22, 24 is engageable with the top end plate 14 and further engageable with the lower vertical end 42 of a vertically upwardly adjacent expansion module. For example, for the FIG. 1 enclosure 10, the expansion module 20 is interconnected and engaged at its upper vertical end 40 with the top end plate 14; the expansion module 22 is interconnected and engaged at its upper vertical end 40 with the lower vertical end 42 of the expansion module 20; and the expansion module 24 is interconnected and engaged at its upper vertical end 40 with the lower vertical end 42 of the expansion module 22. Similarly, the lower vertical end 42 of the expansion modules 20, 22, 24 is engageable with the bottom end plate 16 and further engageable with the upper vertical end 40 of a vertically downwardly adjacent expansion module 20, 22, 24. For the exemplary FIG. 1 enclosure 10, the expansion module 24 is interconnected and engaged at its lower vertical end 42 with the bottom end plate 16; the expansion module 22 is interconnected and engaged at its lower vertical end 42 with the upper vertical end 40 of the expansion module 24; and the expansion module 20 is interconnected and engaged at its lower vertical end 42 with the upper vertical end 40 of the expansion module 22.

FIGS. 1 and 2 show the upper vertical end 40 of the expansion modules 20, 22, 24 and FIGS. 3-6 show various views of the top end plate 14. The top end plate 14 has an inverted U-shape ledge including a horizontal ledge 50 and left and right side ledges 52, 54 that extend forwardly from the horizontal ledge 50 to the front end of the top end plate 14. The ledges 50, 52, 54 project vertically downwardly from a wall 56. The wall 56 has conduit and duplex outlet knock out openings 58, that is, removable partially stamped openings, in the surface thereof, to allow for the mounting and/or routing of wiring, cable, electrical outlets, or other components. The thickness of the horizontal ledge 50 and the side ledges 52, 54 may be the same as that of the rear wall 30 and side walls 34 of the expansion modules 20, 22, 24. For the FIG. 1 enclosure 10, the inverted U-shape upper vertical end 40 of the expansion modules 20, 22, 24, that is, the rear wall 30 and the side walls 34, abuts the inverted U-shape ledge of the top end plate 14, that is, at the horizontal ledge 50 and side ledges 52, 54.

A forward or front end of the top end plate 14 includes a horizontal flange 60 that serves as a stiffener for the top end plate 14 and provides a mounting surface for a frame 500, described below in reference to FIG. 10. The left side of the flange 60 extends to form an interlocking projection 62 and the right side of the flange 60 extends to form an interlocking fastener boss 64. In a similar manner, at the upper vertical end 40 of the expansion modules 20, 22, 24, the left side flange 38 extends to form an interlocking fastener boss 72 and the right side flange 38 extends to form an interlocking projection 74.

For the FIG. 1 enclosure, the left side interlocking projection 62 of the top end plate 14 fits into the left side interlocking fastener boss 72 at the upper vertical end 40 of the expansion module 20, and the right side interlocking projection 74 at the upper vertical end 40 of the expansion module 20 fits into the right side interlocking fastener boss 64 of the top end plate 14. Screws (not shown) may be inserted into the projections 62, 74 to yield an interference fit between the respective projections 62, 74 and fastener bosses 72, 64, thereby engaging the upper vertical end 40 of the expansion module 20 to the top end plate 14 at the forward or front end of the enclosure 10.

Figure 5:
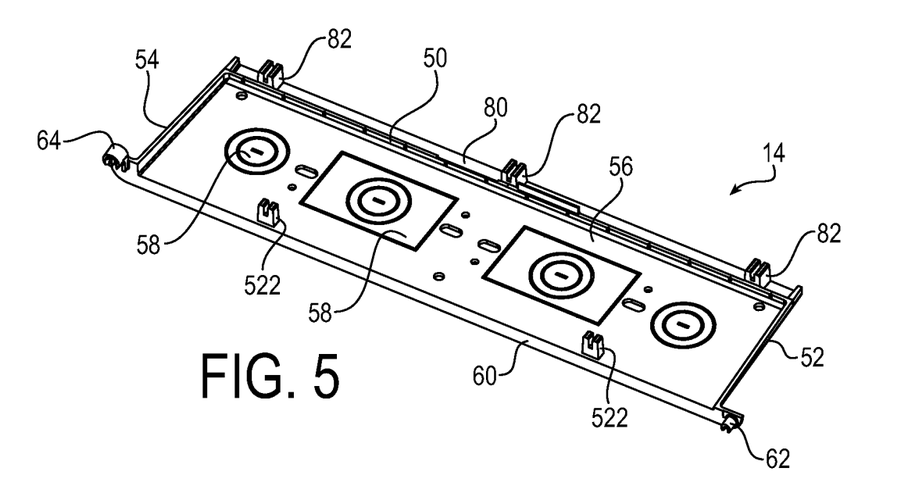
FIG. 5 is a front left side perspective view of the FIG. 3 upper end plate, the view being of the bottom of the upper end plate.
Figure 6:
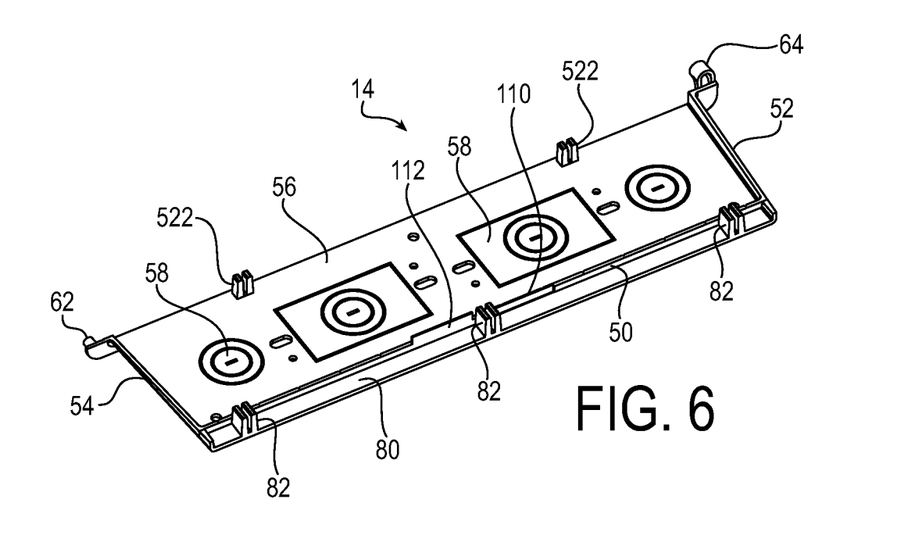
FIG. 6 is a rear left side perspective view of the FIG. 3 upper end plate, the view being of the bottom of the upper end plate.

A rear or back end of the top end plate 14 includes a horizontal flange 80 projecting rearwardly relative to the horizontal ledge 50. Three interlocking fastener bosses 82 are disposed across the back of the top end plate 14 at the left, center and right thereof. The interlocking fastener bosses 82 are supported at their forward edge by the horizontal ledge 50 and at their upper edge by the horizontal flange 80, as best shown in FIG. 6, and project vertically downward beyond the horizontal ledge 50, as best shown in FIG. 5. At the upper vertical end 40 of the expansion modules 20, 22, 24, the rear wall 30 includes three fastener openings 92 at the left, center and right thereof, that correspond in spaced relationship to the left, center and right interlocking fastener bosses 82 of the top end plate 14.

For the FIG. 1 enclosure, as the rear wall 30 of the upper vertical end 40 of the expansion module 20 abuts the horizontal ledge 50 of the top end plate 14, the three downwardly projecting interlocking fastener bosses 82 of the top end plate 14 abut the rear wall 30 at the corresponding locations of the three fastener openings 92, which has the effect of aligning the interlocking fastener bosses 82 with the fastener openings 92. Screws (not shown) may be inserted into the fastener openings 92 and respective fastener bosses 82, thereby engaging the upper vertical end 40 of the expansion module 20 to the top end plate 14 at the rear or back end of the enclosure 10.

Figure 7:
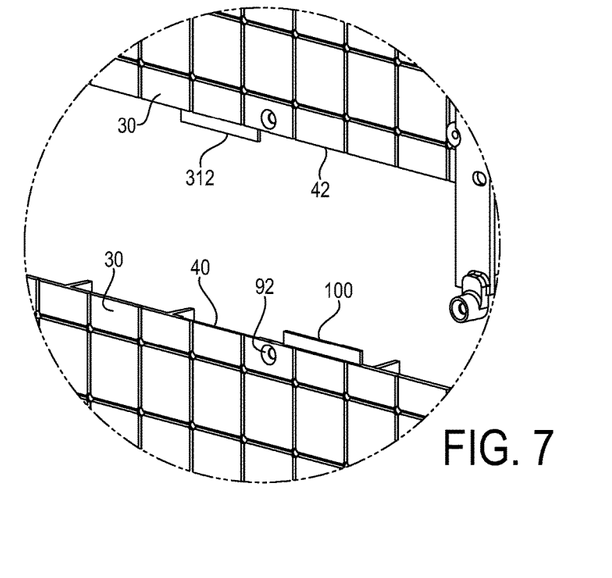
FIG. 7 is an enlarged front perspective view of a tab and recess portion of vertically adjacent expansion modules, as viewed from the circle 7 in FIG. 1.
Figure 8:
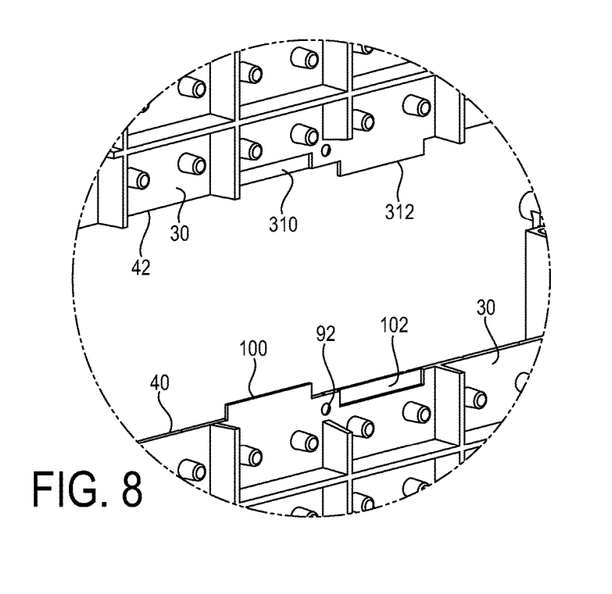
FIG. 8 is an enlarged rear perspective view of a tab and recess portion of vertically adjacent expansion modules, as viewed from the circle 8 in FIG. 2.

Referring to FIGS. 7 and 8, the upper vertical end 40 of the expansion modules 20, 22, 24 also has a tab 100 and recess 102 in a center region of the rear wall 30. The tab 100 and recess 102 are sized and configured for mating relationship with a corresponding recess 110 and tab 112 in a center region of the horizontal ledge 50 of the top end plate 14, as best shown in FIG. 6. The tab 100 and the recess 102 of the expansion modules 20, 22, 24 are within the plane, that is, within the thickness, of the rear wall 30. In the illustrative embodiment, the thickness of the tab 100 and the depth of the recess 102 are each half the thickness of the rear wall 30. Similarly, the tab 110 and the recess 112 of the top end plate 14 are within the plane, that is, within the thickness, of the horizontal ledge 50. In the illustrative embodiment, the thickness of the tab 110 and the depth of the recess 112 are each half the thickness of the horizontal ledge 50. As best shown in FIGS. 5 and 6, the tab 112 of the top end plate 14 projects vertically downwardly beyond the downward vertical extent of the horizontal ledge 50 but less than the downward vertical extent of the three interlocking fastener bosses 82.

For the FIG. 1 enclosure 10, the tab 100 and recess 102, when fitted with the recess 110 and tab 112, aid in preventing the rear wall 30 of the expansion module 20 from bowing relative to the horizontal ledge 50 of the top end plate 14.

As will be appreciated, the relatively small size of the top end plate 14 simplifies handling of the top end plate 14, and simplifies assembling the top end plate 14 to the expansion module 20. This is especially the case when the enclosure 10 is expanded to greater heights. The low profile of the top end plate 14 enables it to be installed on top of an expansion module 20, 22, 24 with a low clearance between the top of the expansion module 20 (in FIG. 1) and for example a structure immediately above the expansion module 20, as the height of the top end plate 14 at its forward end is merely equal to the vertical span or height of the horizontal flange 60 and the interlocking fastener boss 64, and at its back end is merely equal to the vertical span or height of the horizontal ledge 50 and the interlocking fastener bosses 82. Handling of the top end plate 14 is also made easier, as it can be turned lengthwise and set into the space between the side walls 34 of the expansion modules 20, 22, 24, owing to the thickness or vertical dimension of the top end plate 14 being less than the front to rear dimension, that is depth dimension, of the interior of an expansion module 20, 22, 24, and the front to rear dimension of the top end plate 14 being less than the horizontal span between side walls 34 of an expansion module 20, 22, 24.

As noted above, the upper vertical end 40 of the expansion modules 20, 22, 24 is not only engageable with the top end plate 14 but also with the lower vertical end 42 of a vertically upwardly adjacent expansion module 20, 22, 24. Some of the same interfaces and engaging members that engage the expansion module 20 to the top end plate 14 may likewise be employed to enable the connection of, for example, the expansion module 22 to the vertically upwardly adjacent expansion module 20, or the expansion module 24 to the vertically upwardly adjacent expansion module 22. Thus, in the FIG. 1 enclosure 10, the left and right side flanges 38 of the expansion modules 20, 22, 24 may extend to form, respectively, an interlocking projection 262 and an interlocking fastener boss 264. The left side interlocking projection 262 of the expansion module 20 fits into the left side interlocking fastener boss 72 at the upper vertical end 40 of the expansion module 22, and the right side interlocking projection 74 at the upper vertical end 40 of the expansion module 22 fits into the right side interlocking fastener boss 264 of the lower vertical end 42 of the expansion module 20. Likewise, the left side interlocking projection 262 of the expansion module 22 fits into the left side interlocking fastener boss 72 at the upper vertical end 40 of the expansion module 24, and the right side interlocking projection 74 at the upper vertical end 40 of the expansion module 24 fits into the right side interlocking fastener boss 264 of the lower vertical end 42 of the expansion module 22. Screws (not shown) may be inserted into the projections 262, 74 to yield an interference fit between the projections 262, 74 and the respective fastener bosses 72, 264, thereby engaging the upper vertical ends 40 of the expansion modules 22, 24 to the lower vertical ends 42 of the respective vertically upwardly adjacent expansion modules 20, 22 at the forward or front end of the enclosure 10.

As best shown in FIGS. 7 and 8, the lower vertical end 42 of the expansion modules 20, 22, 24 may also have a recess 310 and tab 312 in a center region of the rear wall 30 that are sized and configured for mating relationship with the tab 100 and recess 102 in the rear wall 30 of a vertically upwardly adjacent expansion module 20, 22, 24. For the FIG. 1 enclosure, the recess 310 and tab 312 of the expansion modules 20, 22, 24 are within the plane, that is, within the thickness, of the rear wall 30. In the illustrative embodiment, the depth of the recess 310 and the thickness of the tab 312 are each half the thickness of the rear wall 30.

For the FIG. 1 enclosure 10, the recess 310 and tab 312, when fitted with the tab 100 and recess 102, aid in preventing the rear wall 30 of the expansion module 22 from bowing relative to the rear wall 30 of the vertically upwardly adjacent expansion module 20, and in preventing the rear wall 30 of the expansion module 24 from bowing relative to the rear wall 30 of the vertically upwardly adjacent expansion module 22.

As shown in FIGS. 1 and 2, vertically adjacent expansion modules 20, 22, 24 may also be connected together by a pair of rear wall connectors 326. The rear wall connectors 326 fit into corresponding sized recesses 328 in the rear wall 30 of the expansion modules 20, 22, 24, so as to extend across vertically adjacent modules 20, 22, 24. Screws (not shown) may be used to fasten the rear wall connectors 326 to the rear walls 30 of vertically adjacent expansion modules 20, 22, 24. In the FIG. 1 enclosure 10, the rear wall connectors 326 serve to secure the upper vertical ends 40 of the expansion modules 22, 24 to the lower vertical ends 42 of the respective vertically upwardly adjacent expansion modules 20, 22 at the rear or back end of the enclosure 10.

The lower vertical end 42 of the expansion modules 20, 22, 24 is also configured for engagement with the bottom end plate 16. In the FIG. 1 enclosure 10, the bottom end plate 16 is identical to the top end plate 14 flipped upside down, that is, a 180 degree equivalent of the top end plate 14, and therefore description of the bottom end plate 16 interfaces and engaging elements will be omitted. Further, in the FIG. 1 enclosure 10, the lower vertical end 42 of the expansion modules 20, 22, 24 is identical to the upper vertical end 40 of the expansion modules 20, 22, 24, that is, the lower vertical end 42 is a 180 degree equivalent of the upper vertical end 40. Thus, the interface and engaging elements of the lower vertical end 42 of the expansion modules 20, 22, 24 including the interlocking projection 262, the interlocking fastener boss 264, the three fastener openings 292, the recess 310 and the tab 312 of the lower vertical end 42 of the expansion modules 20, 22, 24 correspond in size and configuration to the respective interface and engaging elements of the upper vertical end 40 of the expansion modules 20, 22, 24 including the interlocking projection 74, the interlocking fastener boss 72, the three fastener openings 92, the recess 102 and the tab 100. Consequently, for the FIG. 1 enclosure 10, the lower vertical end 42 of the expansion module 24 interfaces and engages with the bottom end plate 16, in an identical manner to the above described upper vertical end 40 with the top end plate 14, and therefore description of the interface and engagement of the lower vertical end 42 of the expansion module 24 with the bottom end plate 16 will be omitted.

As will be appreciated, manufacture and assembly of the enclosure 10 is simplified by the invention. In the FIG. 1 enclosure 10, the top end plate 14 and the bottom end plate 16 may be identically manufactured, and the expansion modules 20, 22, 24 may be identically manufactured. Further, in the FIG. 1 enclosure 10, as the top end plate 14 and bottom end plate 16 are identical, either the top or bottom end plate 14, 16 may be assembled to the upper vertical end 40 of an expansion module 20, 22, 24 or the lower vertical end 42 of an expansion module 20, 22, 24. Still further, as the expansion modules 20, 22, 24 have identical vertical upper and lower ends 40, 42, the expansion modules 20, 22, 24 may be oriented with their upper vertical end 40 facing upward or downward, and their lower vertical end 42 facing upward or downward. In this regard, there is no distinction in the FIG. 1 enclosure between what is the top end plate 14 and the bottom end plate 16, and further no distinction between what is the vertical upper end 40 and the vertical lower end 42 of an expansion module 20, 22, 24.

It will further be appreciated that the top and bottom end plates 14, 16 and the upper and lower vertical ends 40, 42 of the expansion modules 20, 22, 24 need not be limited to the above described interfaces and engaging elements. For example, other types of connection techniques may be used in place of, or in addition to, the interlocking projections 74, 262 and interlocking fastener bosses 72, 264, such as overlapping flanges secured together by a bolt and nut connection. Similarly, other types of connection techniques may be used in place of, or in addition to, the fastener openings 92, 292 and the interlocking fastener bosses 82, such as a tongue and groove connection where the opposite vertical ends 40, 42 each define the tongue, and a ledge at the rear edge of the top and bottom end plates 14, 16 forms a mating groove. In a similar manner, other types of connection techniques may be used in place of, or in addition to, the tabs 100, 312 and recesses 102, 310, and/or the rear wall connectors 326 and recesses 328.

In the FIG. 1 embodiment of the invention, the upper vertical end 40 of the expansion modules 20, 22, 24 is identical to the lower vertical end 42 of the expansion modules 20, 22, 24, such that an expansion module 20, 22, 24 is identical if rotated 180 degrees. Likewise, the bottom end plate 16 is identical to the top end plate 14 flipped upside down, that is, a 180 degree equivalent of the top end plate 14. The enclosure 10 need not be so limited and other embodiments are contemplated. For example, the upper vertical end 40 of the expansion modules 20, 22, 24 may have a different configuration with different interfaces and engaging elements from that of the lower vertical end 42 of the expansion modules 20, 22, 24, such that the upper vertical end 40 and the lower vertical end 42 are not 180 degree equivalents and an expansion module 20, 22, 24 is not identical if rotated 180 degrees. Similarly, the top end plate 14 may likewise have a different configuration with different interfaces and engaging elements from that of the bottom end plate 16, such that the top end plate 14 is not merely the same as the bottom end plate 16 flipped upside down, that is, such that the top end plate 14 and bottom end plate are not 180 degree equivalents. As an example of such an enclosure in which the upper and lower vertical ends 40, 42 and the top and bottom end plates 14, 16 are not 180 degree equivalents, the upper vertical end 40 of an expansion module 20, 22, 24 may be configured for engagement with the top end plate 14 and further be configured for engagement with the lower vertical end 42 of a vertically upwardly adjacent expansion module 20, 22, 24, and the lower vertical end 42 of the expansion module 20, 22, 24 may be configured for engagement with the bottom end plate 16 and further be configured for engagement with the vertical upper end 40 of a vertically downwardly adjacent expansion module 20, 22, 24. The modularity of such an enclosure remains in that an expansion module 20, 22, 24 may be inserted between the top and bottom end plates 14, 16 to expand the interior volume of the enclosure, notwithstanding the lack of 180 degree similarity between the upper and lower vertical ends 40, 42 and the top and bottom end plates 14, 16.

Figure 9:
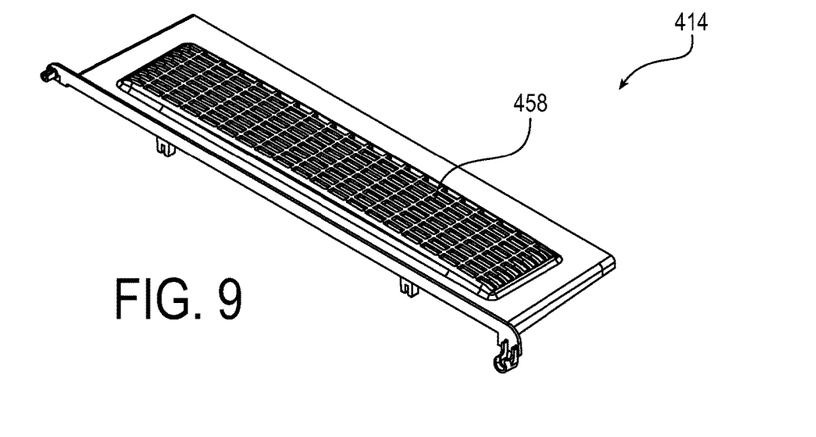

Referring now to FIG. 9, there is shown another embodiment of a top end plate 414. The top end plate 414 has a vent 458 rather than the knock out openings 58 of the afore described top end plate 14; the top end plate 414 is otherwise identical to the top end plate 14. It will be appreciated that either the top end plate 14 or the bottom end plate 16 may have one or more of a knock out opening 58, vent 458, or any other opening or configuration, without effect to the similarity, that is the 180 degree identicalness, in the interface and engaging elements of the top and bottom end plates 14, 16. That is to say, the top end plate 14 may on the one hand be identical to the bottom end plate 16 flipped upside down in respect of the interface or engaging elements that enable the top and end bottom end plates 14, 16 to interconnect and engage with the upper and lower vertical ends 40, 42 of the expansion modules 20, 22, 24, and on the other hand may be different from the bottom end plate 16 in respect of features that do not have a role or effect on the interface and engaging elements that enable the top and end bottom end plates 14, 16 to interconnect and engage with the upper and lower vertical ends 40, 42 of the expansion modules 20, 22, 24. Of course, as with the above described top end plate 14, the top end plate 414 of an enclosure may have different interface and engaging elements from that of a bottom end plate of the enclosure.

It will further be appreciated that the upper and lower vertical ends 40, 42 of the expansion modules 20, 22, 24 may have one or more different configurations, without effect to the similarity, that is the 180 degree identicalness, in the interface and engaging elements of the upper and lower vertical ends 40, 42. That is to say, the upper vertical end 40 of an expansion module 20, 22, 24 may on the one hand be a 180 degree equivalent of the lower vertical end 42 of the expansion module 20, 22, 24 in respect of the interface or engaging elements that enable the upper and lower vertical ends 40, 42 to interconnect and engage with the top and bottom end plates 14, 16 and the upper and lower vertical ends 40, 42 of vertically adjacent expansion modules 20, 22, 24, and on the other hand may be different from the lower vertical end 42 in respect of features that do not have a role or effect on the interface or engaging elements that enable the upper and lower vertical ends 40, 42 to interconnect and engage with the top and bottom end plates 14, 16 and the upper and lower vertical ends 40, 42 of vertically adjacent expansion modules 20, 22, 24.

Figure 10:
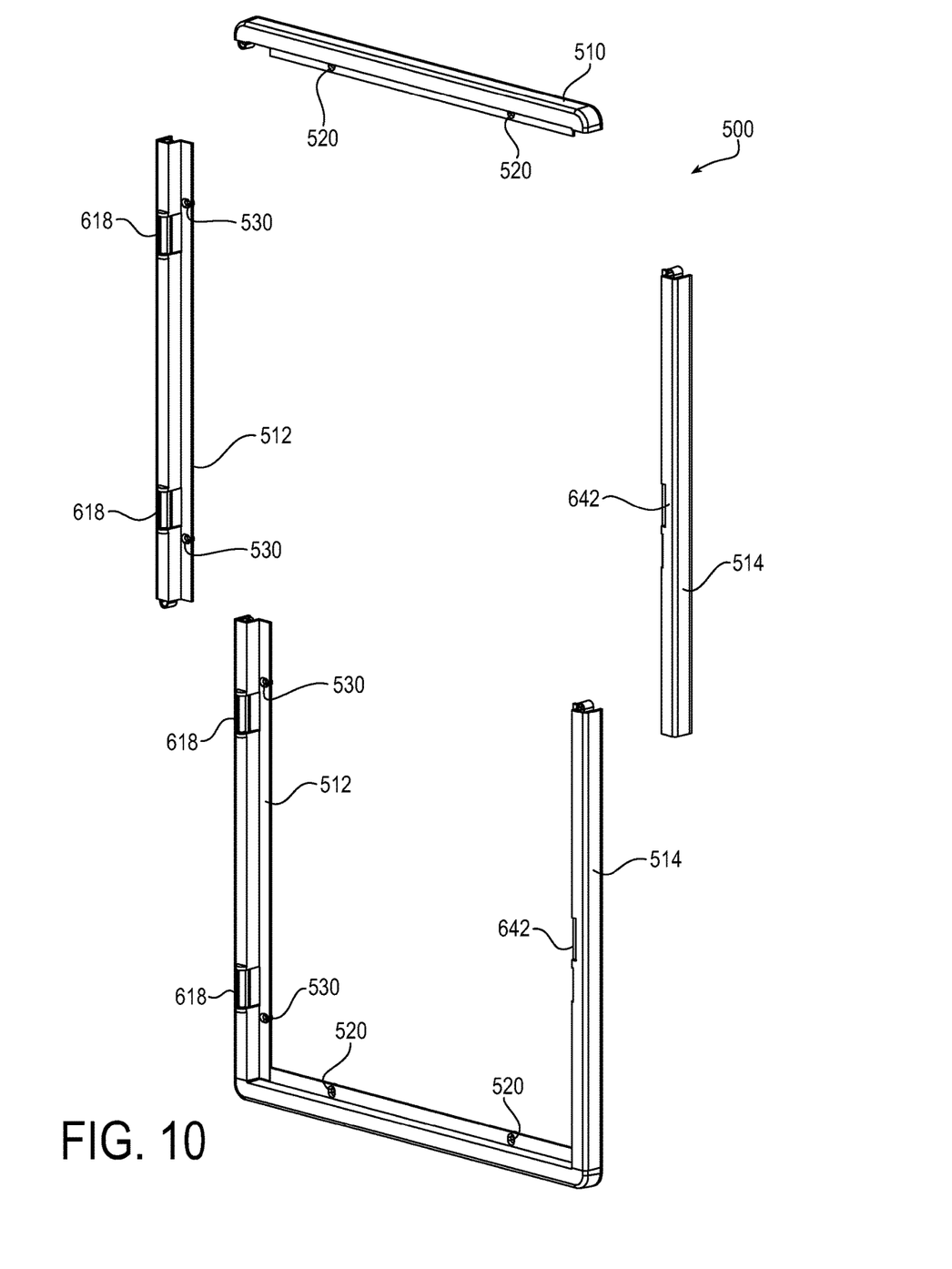
FIG. 10 is a partially exploded front right side perspective view of an exemplary frame of the invention, showing top and bottom frame ends, two intermediate frame hinge sides, and two intermediate frame latch sides.

FIG. 10 shows an exemplary frame 500 of the invention, it being understood that the frame 500 is suited for a two expansion module enclosure rather than a three expansion module enclosure 10 as shown in FIG. 1. The frame 500 includes top and bottom frame ends 510, two intermediate frame hinge sides 512, and two intermediate frame latch sides 514. The top and bottom frame ends 510 have fastener holes 520 that align with fastener bosses 522 in the top and bottom end plates 14, 16. Screws (not shown) may be inserted through the holes 520 and threaded into the fastener bosses 522 to secure the top and bottom frame ends 510 to the top and bottom end plates 14, 16. The frame hinge sides 512 have fastener holes 530 that align with fastener bosses 532 in the left side walls 34 of the expansion modules 20, 22, 24. Screws (not shown) may be inserted through the holes 530 and threaded into the fastener bosses 532 to secure the frame hinge sides 512 to the left side walls 34 of the expansion modules 20, 22, 24. The frame latch sides 514 have fastener holes, hidden from view in FIG. 10, that align with fastener bosses 532 in the right side walls 34 of the expansion modules 20, 22, 24. Screws (not shown) may be inserted through the holes and threaded into the fastener bosses 532 to secure the frame latch sides 514 to the right side walls 34 of the expansion modules 20, 22, 24. The frame hinge sides 512 are identical in construction to the frame latch sides 514, save for a pair of hinge openings 550 in the frame hinge sides 512 and a latch opening 552 in the frame latch side 514, so that the location of the fastener holes 530 in the frame hinge sides 512 is identical to the location of the fastener holes in the frame latch sides 514. As such, the frame hinge sides 512 may be attached to the right side fastener bosses 532 and the frame latch sides 514 may be attached to the left side fastener bosses 532.

Figure 11:
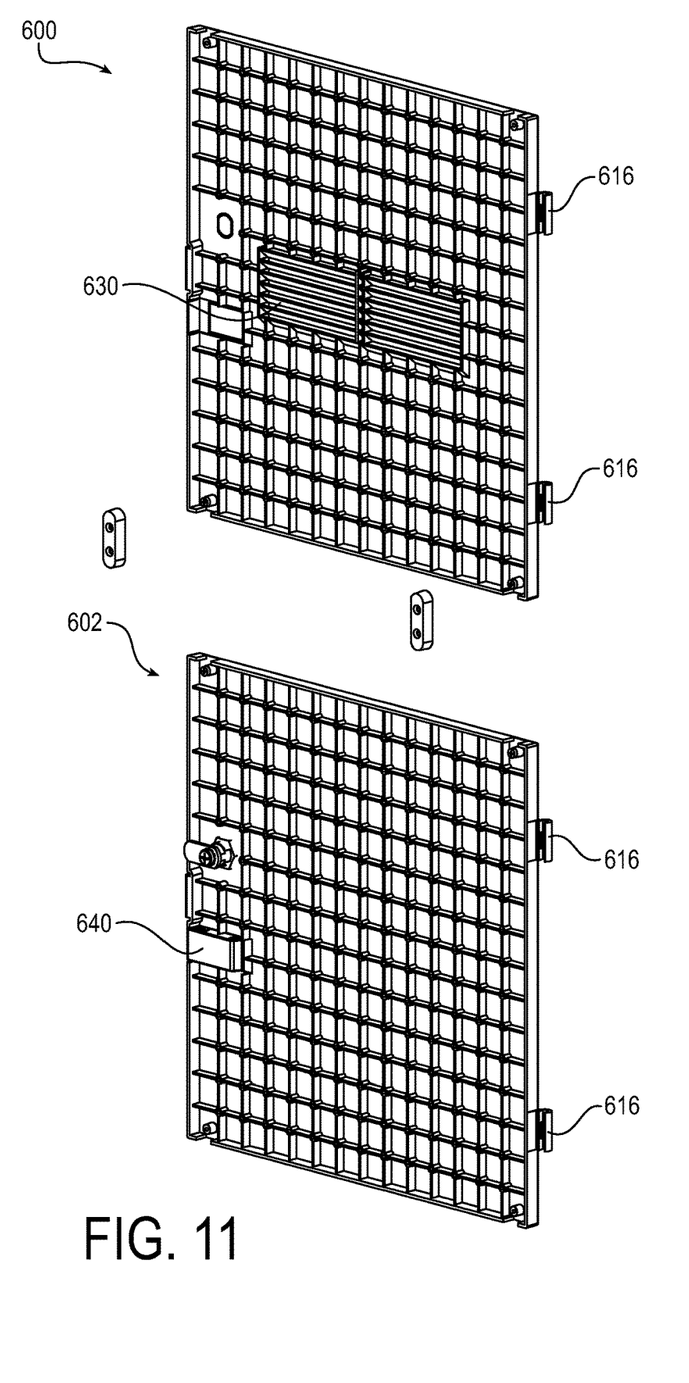
FIG. 11 is an exploded rear left side perspective view of exemplary doors of the invention, that are configured for hinged connection to the FIG. 10 intermediate frame sides.
Figure 12:
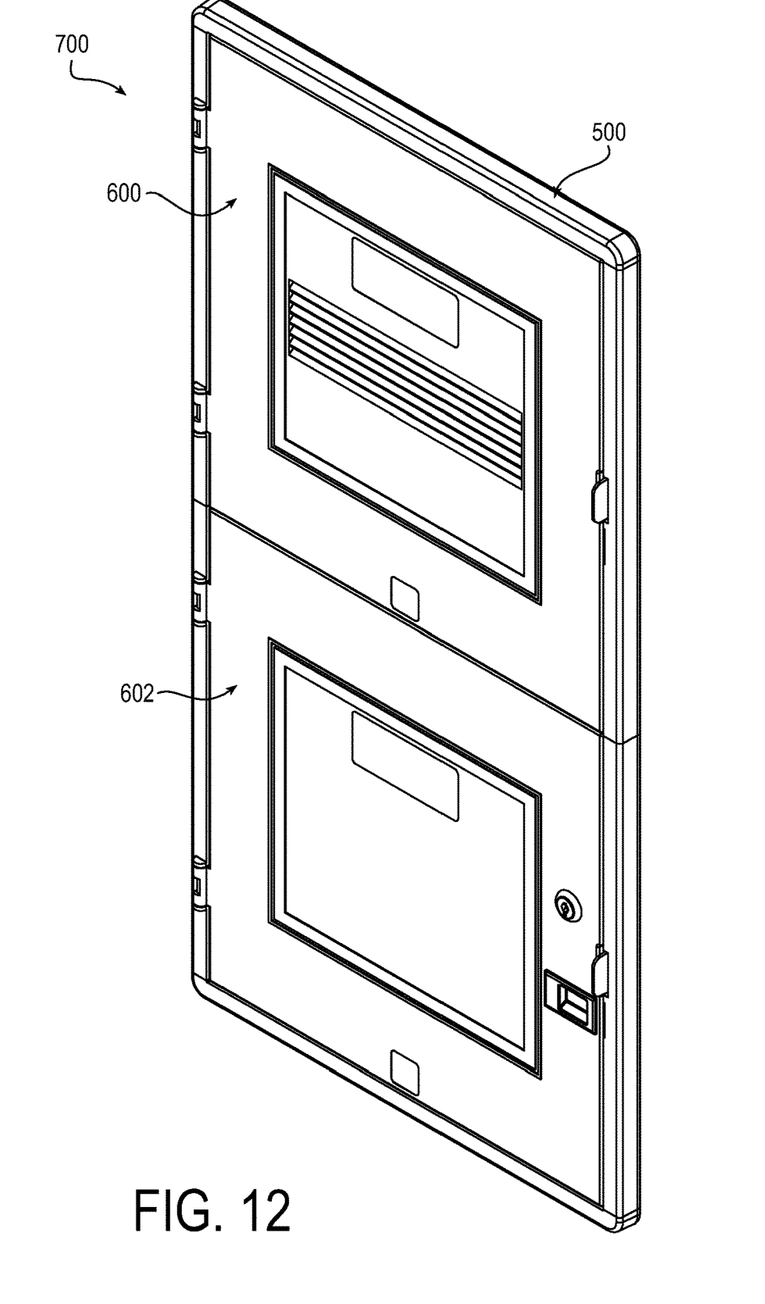
FIG. 12 is a front perspective view of an assembly of the FIG. 10 door frame and FIG. 11 doors.

FIG. 11 shows a pair of exemplary doors 600, 602 of the invention. The doors 600, 602 include hinge projections 616 that fit into corresponding hinge openings 618 of the frame hinge sides 512. The hinge projections 616 and hinge openings 618 cooperate to enable the doors 600, 602 to swing in an open and close manner, respectively allowing and prohibiting access to the interior volume of the enclosure 10. The door 600 is equipped with a louver 630 while the door 602 includes a latch 640 that can be operated to selectively engage and disengage a corresponding latch receptacle 642 in the frame latch side 514. FIG. 12 shows an assembly 700 of the FIG. 10 door frame 500 and the FIG. 11 doors 600, 602.

Figure 13:
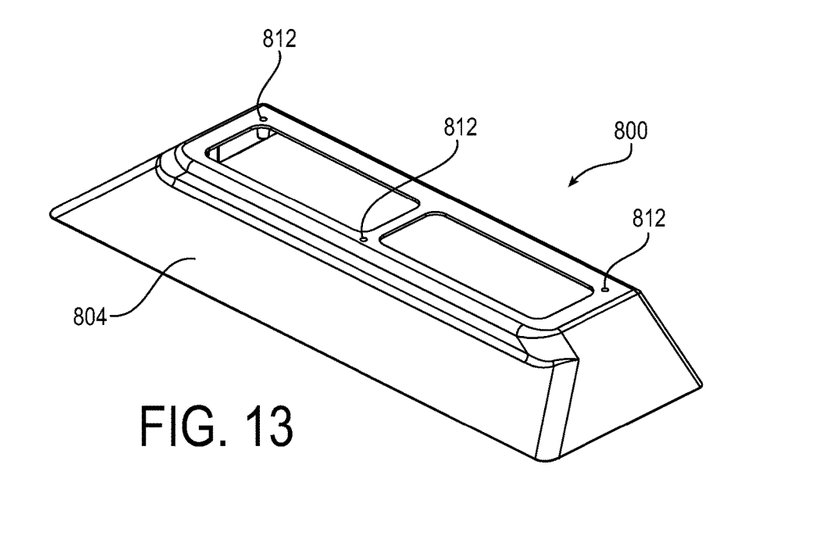
FIG. 13 is front perspective view of an exemplary floor stand of the invention.

FIG. 13 shows an exemplary floor stand 800 of the invention. The floor stand 800 has an elevated enclosure seat 802 and a relatively wider base 804 extending downward from the enclosure seat 802. The enclosure seat 802 may have cut outs 806 to allow for the mounting and/or routing of wiring, cable, or components. The enclosure seat 802 is configured to conform with the bottom end plate 16 of the enclosure 10. The bottom end plate 16 has fastener holes 810 (see FIG. 1) that align with respective fastener bosses 812 in the enclosure seat 802. Screws (not shown) may be inserted through the holes 810 and threaded into the fastener bosses 522 to secure the bottom end plate 16, and thus the enclosure 10, to the enclosure seat 802 of the floor stand 800. The base 804 has front, left and right side ramp portions and a vertically planar rear wall that lies in the same plane as the rear wall 30 of the enclosure 10. The floor stand 800 serves to maintain the enclosure 10 in abutting relation to for example dry wall or other support structure while also allowing for passage of wiring, cables, etc. through its base 804.

Figure 14:
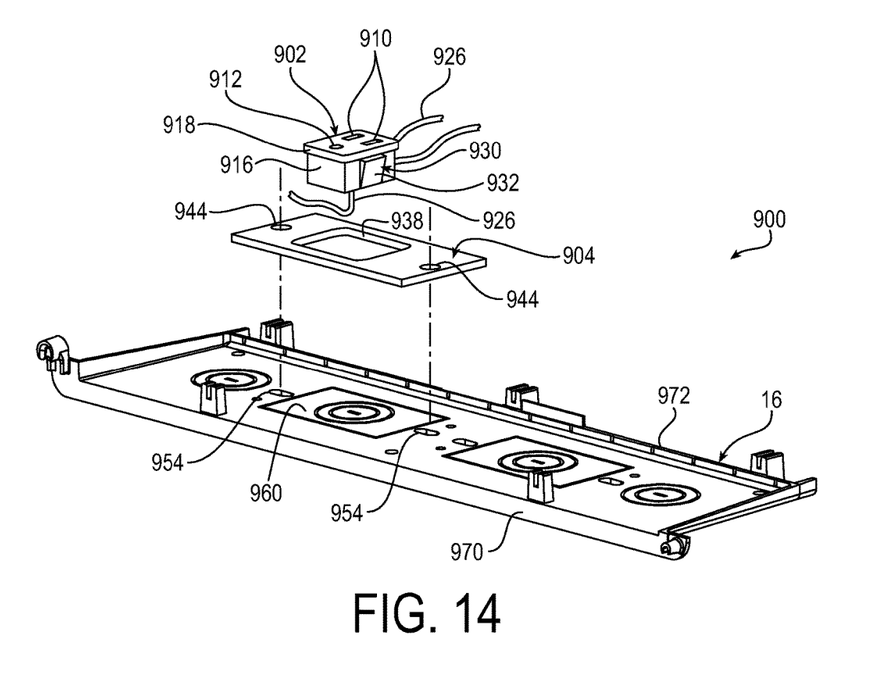
FIG. 14 is an exploded front right side perspective view of an exemplary enclosure electrical receptacle assembly of the invention.

FIG. 14 shows an exemplary enclosure electrical receptacle assembly 900 of the invention. The receptacle assembly 900 includes an electrical receptacle 902 and a support plate or bracket 904. The electrical receptacle 902 has provisions for a suitable three prong electrical appliance (not shown) such as an enclosure charge pack. The provisions of the electrical receptacle 902 include two parallel rectangular slot openings 910 configured for receipt of corresponding flat blades of the electrical appliance, and a ground pin opening 912 configured for receipt of a ground pin of the electrical appliance. The electrical receptacle 902 has a box shape base 916 that extends upward into an upper ledge 918. The box shape base 916 contains the terminal end portions of electrical wiring 926 fitted to electrical contacts, also in the base 916, corresponding to the rectangular slot openings 910 and ground pin opening 912. The upper ledge 918 has a larger cross section in top plan view than the cross section of the base 916. A suitable retaining clip 930 is mounted to the bottom of the base 916 to provide spring clips 932 at opposite sides of the base 916. Each spring clip 932 is adapted to be flexed between an unflexed outward state and a flexed inward state. The base 916 is sized to fit into a corresponding sized opening 938 in the support bracket 904. As the base 916 is inserted into the corresponding sized opening 938, the spring clips 932 on opposite sides of the base 916 flex inward until the upper ledge 918 of the electrical receptacle 902 abuts the top surface of the support bracket 904, whereupon the spring clips 932 flex back to their unflexed outward state underneath the support bracket 904, thereby securing the electrical receptacle 902 to the support bracket 904.

The support bracket 904 has a pair of fastener openings 944 at horizontally opposite sides thereof that correspond in position to respective openings 954 in the bottom end plate 16. The support bracket 940 has a perimeter slightly larger than that of an electrical outlet knock out opening 960 in the bottom end plate 16. The knock out portion 960 is removed to accommodate receipt of the electrical receptacle 902. The fastener openings 944 of the support bracket 904 may be aligned with the fastener openings 954 of the bottom end plate 16, and a suitable fastener may be routed through the openings 944, 954 to mount the support bracket 904 to the bottom end plate 16.

The electrical receptacle 910, once mounted, orients the parallel rectangular slot openings 910 to be perpendicular to front and rear edges 970, 972 of the bottom end plate 16 and, accordingly, the rear wall 30 of the enclosure 10. As such, the electrical receptacle 910 provides for the ability to have the flat blades of the electrical appliance plugged into the openings 910, 912 and have clearance for the electrical appliance to project forward, that is outward, from the front of the enclosure 10.

In the description, "upper", "lower", "top", "bottom," "end," "inner," "outer," "left," "right," "forward," "rear," "front," "back," "above," "below," "horizontal," "vertical," "upward," "downward," etc. refer to the components, surfaces, or other features as viewed from a right side perspective, for example the exemplary modularly expandable enclosure 10 as viewed from the perspective shown in FIG. 1, and such references should be understood as referring to an arbitrary frame of reference, rather than to the ordinary gravitational frame of reference. Thus, a top component or surface, a bottom component or surface, a front component or surface, and a rear component or surface may extend upwardly, downwardly, diagonally, or horizontally in a gravitational frame of reference.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A modularly expandable enclosure comprising:
a top end plate;
a bottom end plate; and
one or more elongated tray modules vertically between the top end plate and the bottom end plate, wherein the top end plate, the bottom end plate and the one or more tray modules define at least a portion of an interior space of the enclosure;
wherein opposite vertical ends of each tray module define an upper end connecting portion and a lower end connecting portion, wherein the upper end connecting portion is configured for engagement with the top end plate and further configured for engagement with a lower end connecting portion of a vertically upwardly adjacent module tray, and wherein the lower end connecting portion is configured for engagement with the bottom end plate and further configured for engagement with an upper end connecting portion of a vertically downwardly adjacent tray module;
wherein the top end plate is a 180 degree equivalent of the bottom end plate;
wherein each of the one or more elongated tray modules has an inverted U-shade structure including a vertically extending rear wall and vertically extending side walls projecting forwardly from the rear wall, and wherein the interior space is open forwardly from the rear wall and open between the ends of the forwardly projecting side walls such that the tray module has an open front.

2. The modularly expandable enclosure of claim 1, wherein the height of the interior space of the enclosure is equal to the height of the one or more elongated tray modules between the top end plate and the bottom end plate.

3. The modularly expandable enclosure of claim 1, wherein the expandable enclosure across multiple assembled tray modules has a continuous vertical back surface without interruptions.

4. The modularly expandable enclosure of claim 1, wherein the top end plate has an inverted U-shape ledge that abuts an inverted U-shape upper distal end of the upper end connecting portion of the tray module.

5. The modularly expandable enclosure of claim 1, wherein the bottom end plate has an inverted U-shape ledge that abuts an inverted U-shape lower distal end of the lower end connecting portion of the tray module.

6. The modularly expandable enclosure of claim 1, wherein a forward end of the top end plate includes a horizontal flange and at least one interlocking fastener boss that is configured for connection to the upper end connecting portion of the tray module, and wherein the height of the forward end is equal to the height of the forward flange and the height of the interlocking fastener boss.

7. The modularly expandable enclosure of claim 1, wherein a back end of the top end plate includes a horizontal ledge that abuts an upper distal end of the upper end connecting portion of the tray module, and at least one interlocking fastener boss that is configured for connection to the upper end connecting portion of the tray module, and wherein the height of the back end is equal to the height of the horizontal ledge and the height of the interlocking fastener boss.

8. The modularly expandable enclosure of claim 1, wherein the upper end connecting portion is a 180 degree equivalent of the lower end connecting portion.

9. A modularly expandable enclosure comprising:
a top base plate, a bottom base plate and one or more vertically extending expansion modules vertically between the top base plate and the bottom base plate;
wherein opposite vertical ends of at least one of the expansion modules are 180 degree equivalents and are configured for engagement with the top base plate, the bottom base plate, and either of the opposite vertical ends of another, vertically adjacent expansion module;
wherein each of the one or more vertically extending expansion modules has an inverted U-shape structure including a vertically extending rear wall and vertically extending side walls projecting forwardly from the rear wall, and wherein an interior space is open forwardly from the rear wall and open between the ends of the forwardly projecting side walls such that the expansion module has an open front.

10. The modularly expandable enclosure of claim 9, wherein the expansion module has upper and lower vertical ends and each of the upper and lower vertical ends has an inverted U-shape edge.

11. The modularly expandable enclosure of claim 10, wherein the top base plate has an inverted U-shape ledge that is commensurate with and abuts the inverted U-shape edge of the upper vertical end of the expansion module.

12. The modularly expandable enclosure of claim 10, wherein the bottom base plate has an inverted U-shape ledge that is commensurate with and abuts the inverted U-shape edge of the lower vertical end of the expansion module.

13. A modularly expandable enclosure comprising:
tray modules each having a bottom and two sides, and
mounting structure at opposite ends of the tray modules for connection with an end closure or another tray module;
further including the end closure, wherein the thickness of the end closure is less than the front to rear dimension of the sides of the tray module, and the front to rear dimension of the end closure is less than the horizontal span between the sides.

14. The modularly expandable enclosure of claim 13, wherein the tray modules have identical mounting structure.

15. The modularly expandable enclosure of claim 13, wherein one end of the tray module is a 180 degree equivalent to the opposite end of the tray module.

16. The modularly expandable enclosure of claim 13, further including the end closure, and wherein the end closure has mounting structure for connection with the mounting structure of the tray module, and wherein a portion of the mounting structure of the tray module is identical to a portion of the mounting structure of the end closure.

17. A media enclosure, comprising:
at least one tray module having a rear wall and opposite side walls projecting forwardly from the rear wall;
at least one end plate for enclosing an end of the tray module, the end plate having an electrical outlet opening;
an electrical receptacle mountable within the electrical outlet opening in the end plate, the electrical receptacle including parallel rectangular slot openings and a ground pin opening for receipt of electrical flat blades and a ground pin of an electrical appliance, wherein the rectangular slot openings are oriented perpendicular to the rear wall of the tray module such that the electrical receptacle provides for the ability to have the flat blades and ground in of the electrical appliance to be plugged into the respective slot openings and ground pin opening and have clearance for the electrical appliance to project outward from a front of the enclosure, wherein the electrical receptacle is mounted in a support bracket that is mounted to the end plate such that the electrical receptacle is received in the electrical outlet opening in the end plate.

* * * * *